United States Patent
Giduturi (10) Patent No.: US 11,960,744 B2
(45) Date of Patent: Apr. 16, 2024

(54) REGISTER OPERATION IN MEMORY DEVICES

(71) Applicant: Micron Technology, Inc., Boise, ID (US)

(72) Inventor: Hari Giduturi, Folsom, CA (US)

(73) Assignee: Micron Technology, Inc., Boise, ID (US)

( * ) Notice: Subject to any disclaimer, the term of this patent is extended or adjusted under 35 U.S.C. 154(b) by 14 days.

(21) Appl. No.: 17/163,683

(22) Filed: Feb. 1, 2021

(65) Prior Publication Data

US 2022/0244874 A1 Aug. 4, 2022

(51) Int. Cl.
*G06F 3/06* (2006.01)

(52) U.S. Cl.
CPC .......... *G06F 3/0644* (2013.01); *G06F 3/0604* (2013.01); *G06F 3/0679* (2013.01)

(58) Field of Classification Search
CPC ..... G06F 3/0644; G06F 3/0604; G06F 3/0679
USPC ......................................................... 711/154
See application file for complete search history.

(56) References Cited

U.S. PATENT DOCUMENTS

| | | |
|---|---|---|
| 10,783,968 B2 | 9/2020 | Mai et al. |
| 2006/0080661 A1 | 4/2006 | Brokenshire et al. |
| 2007/0028146 A1 * | 2/2007 | Ruckerbauer ............ G11C 7/24 |
| | | 711/100 |
| 2009/0150624 A1 | 6/2009 | Resnick et al. |
| 2014/0223111 A1 | 8/2014 | Dinkjian et al. |
| 2016/0118089 A1 | 4/2016 | Ebeling et al. |
| 2019/0004729 A1 | 1/2019 | Qawami et al. |
| 2019/0227741 A1 * | 7/2019 | Carlough ................ G06F 3/068 |
| 2019/0348123 A1 * | 11/2019 | Mai ........................ G11C 16/08 |
| 2021/0365212 A1 * | 11/2021 | Willits .................. G06F 3/0673 |
| 2021/0397553 A1 * | 12/2021 | Park ...................... G06F 3/0604 |

OTHER PUBLICATIONS

International Search Report and Written Opinion for PCT Application No. PCT/US2022/011468 dated May 3, 2022 (11 pages).

* cited by examiner

*Primary Examiner* — Gautam Sain
*Assistant Examiner* — Wei Ma
(74) *Attorney, Agent, or Firm* — Fletcher Yoder, P.C.

(57) ABSTRACT

A semiconductor device includes a memory partition. The semiconductor device further includes a plurality of registers. A first register of the plurality of registers, when in operation, controls an operation associated with the memory partition. The semiconductor device additionally includes a memory controller. When in operation, the memory controller accesses a first location of the memory partition concurrently with accessing the first register.

21 Claims, 3 Drawing Sheets

REGISTER OPERATION IN MEMORY DEVICES

BACKGROUND

Field of the Present Disclosure

Embodiments of the present disclosure relate generally to the field of semiconductor devices. More specifically, embodiments of the present disclosure relate to registers disposed on a memory die.

Description of Related Art

A semiconductor device, such as a microcomputer, memory, gate array, among others, may include various registers utilized in the operation of the device. For example, address registers, command registers, status, and data registers all can be utilized in conjunction with respective operations involving the device, such as read and write operations. Additionally, for example, a mode register or other registers may be utilized in the device, for example, when the device is a memory device. Access to the registers of the device is typically restricted to authorized access and the accesses may also be restricted to particular times (e.g., when the device is idle). With this in mind, it is desirable to provide improved systems and methods for accessing of registers of a device, for example, a memory device more efficiently. Embodiments of the present disclosure may be directed to one or more of the problems set forth above.

DETAILED DESCRIPTION

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Modern memory devices (chips) typically contain a number of registers that are accessible by a memory controller. These registers can represent or contain information such as configuration settings of the device, status of the device, device parameters, as well as predetermined patterns that can be written across the semiconductor device (e.g., die). One example of a register that is accessible by the controller and can include one or more of configuration settings of the device, status of the device, device parameters, as well as predetermined patterns is a mode register (or a plurality of mode registers).

The memory controller accessible registers of the memory device, such as the mode register, typically span read-only, write-only, and read-write uses and the register architecture in a memory device may typically be designed for use during power-up initialization, thus limiting their throughput capability. Additionally, register accesses are typically restricted in that they require all array operations of the memory device to be completed (i.e., the memory device to be in an idle mode) before any register operations can be initiated. However, there are memory operations in which continued access to a memory array of the memory device is provided so as to maintain the system throughput. Thus, typical breaks in array accesses, for example, to allow for register operations to occur, may not be possible as these breaks would impact the overall efficiency of the system.

Accordingly, present embodiments allow for register operations concurrent with array operations. In some embodiments, the memory device is not operating in an idle mode to initiate access requests to registers. Instead, for example, register read and register write operations can be interspersed with memory array read and write operations instead of register read and register write operations being initiated when the memory device is in an idle mode (e.g., while no read or write operations to the memory array are being performed). Furthermore, in some embodiments, register read and write operations are initiated and executed without being interspersed with respect to one another (i.e., back-to-back or otherwise with no gaps in time therebetween). Similarly, reads from the same register repeatedly can be initiated and executed without being interspersed with respect to one another (i.e., back-to-back or otherwise with no gaps in time therebetween). In other embodiments, register write operations may operate in a similar manner or may require gaps in time with respect to one another, for example, when writes are to configuration registers that modify the behavior of the memory device itself (i.e., sequential writes may include sufficient time periods therebetween to allow for the configuration registers to reflect or execute a modification of the behavior of the memory device).

Figure 1:
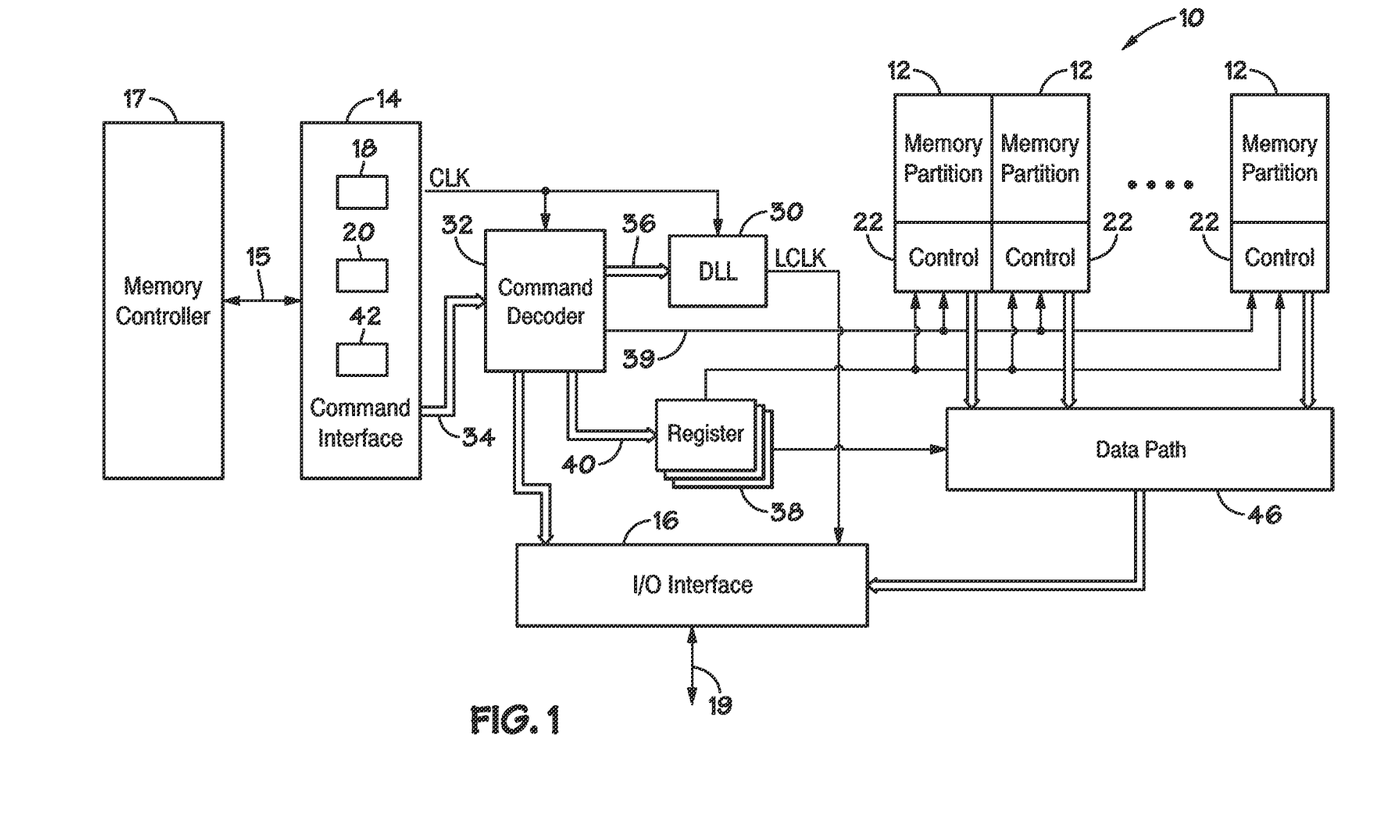
FIG. 1 is a simplified block diagram illustrating certain features of a memory device, according to an embodiment of the present disclosure.

Turning now to the figures, FIG. 1 is a simplified block diagram illustrating certain features of a memory device 10. Specifically, the block diagram of FIG. 1 is a functional block diagram illustrating certain functionality of the memory device 10. In accordance with one embodiment, the memory device 10 may be a random access memory (RAM) device, a dynamic RAM (DRAM) device, a static RAM (SRAM) device (including a double data rate SRAM device), flash memory, and/or a phase change memory (PCM) device, each having a corresponding logic storing device (e.g., a capacitor, a resistor, or the resistance of the chalcogenide material(s)) of memory cells of the memory device.

In some embodiments, when the memory device 10 is a PCM device, it may be a 3D) (Point memory device as a non-volatile memory that utilizes chalcogenide material(s)

to allow for state changes of memory cells therein. The changing of one state to another, for example, a crystalline phase (e.g., an orderly phase of the material of the memory cells of the PCM device) having a relative low resistance to an amorphous phase (e.g., a disorderly phase of the material of the memory cells of the PCM device) having relative high resistance may be controlled through the application of, for example, heat to the materials of the PCM. The states themselves, based on their differences in resistivity, represent whether the phase change memory cell stores "1" or "0" as a binary value.

The memory device 10 may include a number of memory partitions 12 each inclusive of one or more arrays (i.e., memory arrays). Various configurations, organizations, and sizes of the memory partitions 12 on the memory device 10 may be utilized depending on the application and design of the overall system. The memory device 10 may also include a command interface 14 and an input/output (I/O) interface 16. The command interface 14 is configured to provide a number of signals from an external device, such as a processor or controller (e.g., memory controller 17). In some embodiments, a bus 15 (or a signal path or another group of signal paths) may, individually or in combination, allow for bidirectional transmission of signals between the command interface 14 and the processor or controller (e.g., the memory controller 17). Likewise, a bus 19 (or a signal path or another group of signal paths) may, individually or in combination, allow for bidirectional transmission of signals, including, for example, data signals, between the I/O interface 16 and, for example, the processor or controller (e.g., the memory controller 17). Thus, the processor or controller, for example, the memory controller 17 may provide various signals to the memory device 10 to facilitate the transmission and receipt of data to be written to or read from the memory device 10.

As will be appreciated, the command interface 14 may include a number of circuits, such as a clock input circuit 18 and a command address input circuit 20, for instance, to ensure proper handling of the received signals. The command interface 14 may receive one or more clock signals from an external device, such as a processor or controller (for example, the memory controller 17). Likewise, the command interface receives commands (e.g., read command, write command, etc.), which may be entered on the positive edges of the clock signal, as well as data, which typically is transmitted or received on both positive and negative clock edges. In some embodiments, the commands can be of a variable clock length (e.g., one or more clocks are used to receive the commands).

The clock input circuit 18 receives the one or more clock signals and generates an internal clock signal CLK therefrom. In some embodiments, the internal clock signal CLK is supplied to an internal clock generator 30, such as a delay locked loop (DLL) circuit. The internal clock generator 30 generates a phase controlled internal clock signal LCLK based on the received internal clock signal CLK. The phase controlled internal clock signal LCLK is supplied to the I/O interface 16, for instance, and is used as a timing signal for determining an output timing of read data.

The internal clock signal CLK may also be provided to various other components within the memory device 10 and may be used to generate various additional internal clock signals. For instance, the internal clock signal CLK may be provided to a command decoder 32. The command decoder 32 may receive command signals from the command bus 34 and may decode the command signals to provide various internal commands. For instance, the command decoder 32 may provide command signals to the internal clock generator 30 over the bus 36 to coordinate generation of the phase controlled internal clock signal LCLK. The phase controlled internal clock signal LCLK may be used to clock data through the I/O interface 16, for instance.

Further, the command decoder 32 may decode commands, such as read commands, write commands, register set commands, activate commands, etc., and provide access to a particular memory partition 12 corresponding to the command, via bus path 39. The command decoder 32 may also transmit various signals to one or more registers 38 via, for example, bus path 40 (e.g., one or more global wiring lines). As will be appreciated, the memory device 10 may include various other decoders, such as row decoders and column decoders, to facilitate access to the memory partitions 12. In one embodiment, each memory partition 12 includes a control block 22 which provides the necessary decoding (e.g., row decoder and column decoder), as well as other features, such as timing control and data control, to facilitate the execution of commands to and from the memory partitions 12.

In certain embodiments, the command decoder 32 or other component in the memory device 10 may provide register commands to the one or more registers 38, which may be utilized in operations of each memory partition 12, each control block 22 (or partition controller therein), and the like. For example, one of the one or more registers 38 may operate to define various modes of programmable operations and/or configurations of the memory device 10. Registers 38 can be included in semiconductor devices to define operations for various types of memory components, such as DRAM, synchronous DRAM, chalcogenide memories (e.g., PCM) or other types of memories. The one or more registers 38 may receive various signals from the command decoder 32 or the like via global wiring lines 40. The global wiring lines 40 may include a common data path, a common address path, a common write command signal path, and a common read command signal path. The global wiring lines 40 may traverse across the memory device 10, such that each register 38 may couple to the global wiring lines 40. The additional registers may involve additional wiring across the semiconductor device (e.g., die), such that the registers are communicatively coupled to the corresponding memory components.

The one or more registers 38 operate as an example of registers that, when in operation, are accessed or otherwise accessible by the memory controller 17. The registers accessible by the memory controller 17 can be dispersed across the memory device 10 and the these registers can represent or contain information such as configuration settings of the memory device 10 and/or specific components therein, status of the memory device 10 and/or specific components therein, memory device 10 parameters and/or specific parameters for components of the memory device 10, as well as predetermined patterns that can be written across the memory device (e.g., in one or more of the memory partitions 12). Thus, while the one or more registers 38 is illustrated in FIG. 1, it should be appreciated that additional and/or alternative registers are located in the memory device and these registers are accessible by the memory controller 17 (i.e., when in operation, the registers are accessed by the memory controller 17). These accesses by the memory controller 17 may include, for example, reads of the registers (e.g., read accesses) and/or writes to the registers (e.g., write accesses).

The memory device 10 executes operations, such as read commands and write commands, based on the command/ address signals received from an external device, such as a processor and/or by the memory controller 17. In one embodiment, command/address signals are clocked to the command interface 14 using clock signals. The command interface may include a command address input circuit 20 which is configured to receive and transmit the commands to provide access to the memory partitions 12, through the command decoder 32, for instance. In addition, the command interface 14 may receive memory select signals that enable the memory device 10 to process commands on the incoming command/address signals. Access to specific memory partitions 12 within the memory device 10 can be encoded in the commands.

In addition, the command interface 14 may be configured to receive a number of other command signals. For instance, a reset command may be used to reset the command interface 14, status registers, state machines and the like, during power-up for instance. Various signals to facilitate testing of the memory device 10 may be provided, as well. For instance, the testing signals may be used to place the memory device 10 into a test mode for connectivity testing. The command interface 14 may also be used to provide an alert signal or another alarm signal to the system processor or controller for certain errors that may be detected. However, in some embodiments, the I/O interface 16 may additionally or alternatively be utilized to transmit an alert signal, for example, a thermal alert.

Data may be sent to and from the memory device 10, utilizing the command and clocking signals discussed above, by transmitting and receiving data signals through the I/O interface 16. More specifically, the data may be sent to or retrieved from the memory partitions 12 over the data path 46, which includes a plurality of bi-directional data buses. Data I/O signals, are generally transmitted and received in one or more bi-directional data busses to and from the I/O interface 16. For certain memory devices, such as a DDR5 SDRAM memory device, the I/O signals may be divided into upper and lower bytes; however, such segmentation is not required for other memory device types.

As will be appreciated, various other components such as power supply circuits (for receiving external VDD and VSS signals), read/write amplifiers (to amplify signals during read/write operations), temperature sensors (for sensing temperatures of the memory device 10), etc., may also be incorporated into the memory device 10 in addition to the memory controller 17 accessible registers described above. Accordingly, it should be understood that the block diagram of FIG. 1 is only provided to highlight certain functional features of the memory device 10 to aid in the subsequent detailed description.

In some embodiments, the memory device 10 may be equipped with an additional register accessible by the memory controller 17, interface register 42. It should be appreciated that the interface register 42 is illustrated as being disposed in the command interface 14; however, the interface register 42 may alternatively be disposed in a separate location in the memory device 10. The interface register 42 may be, for example, one or more CMOS registers or another type of register and may operate to store one or more particular data patterns that are utilized to calibrate an interface, such as the command interface 14. This calibration may be undertaken periodically, for example, at predetermined times or subsequent to an amount of usage of the command interface 14 and/or the memory device 10.

The storage of calibration patterns in the interface register 42 can reduce and/or eliminate storage of the patterns in a memory partition 12. Thus, the interface register 42 (instead of a memory partition 12) may be subject to a high number of reads, which reduces degradation of memory cell performance in the memory partition 12 that might otherwise occur were the calibration patterns to be stored therein. Moreover, by utilizing a CMOS register or another robust register, the interface register 42 is able to withstand a large number of accesses. Storage of the calibration patterns in the interface register 42 may additionally free up space in the memory partitions 12. Finally, location of the calibration patterns in the interface register may allow for the memory controller 17 to initialize and conduct reads of the patterns from the interface register 42 without impacting memory device 10 operations. In this manner, the memory controller 17 can operate in conjunction with the interface register 42 to calibrate the interface (i.e., the command interface) periodically, thus preserving the quality of service (i.e., speed) of the memory device 10.

In some embodiments, it may be advantageous for the memory controller 17 to access registers of the memory device 10, such as, for example, the one or more registers 38, the interface register 42, and/or additional registers, on-the-fly. This on-the-fly access by the memory controller 17 may allow for adjustments to be made to the memory device 10 at an application level in real time (i.e., as the memory device 10 is in operation). For example, the temperature of the memory device 10 may be monitored (e.g., via temperature sensors) and an indication of whether the sensed temperature exceeds a predetermined level may be stored in a temperature register or another memory controller 17 accessible register. This indication may be read and used to reduce temperature in the memory device 10, for example, throttling the operational speed of the memory device 10. Because the operating temperature of the memory device 10 changes during operation of the memory device 10, real time access (i.e., access concurrent with the operation of the memory device 10) is beneficial. Accordingly, in some embodiments, the memory controller 17 operates to access registers of the memory device 10 in real time (i.e., concurrently with other operations of the memory device 10). One technique for this concurrent access is described below with respect to FIG. 2.

Figure 2:
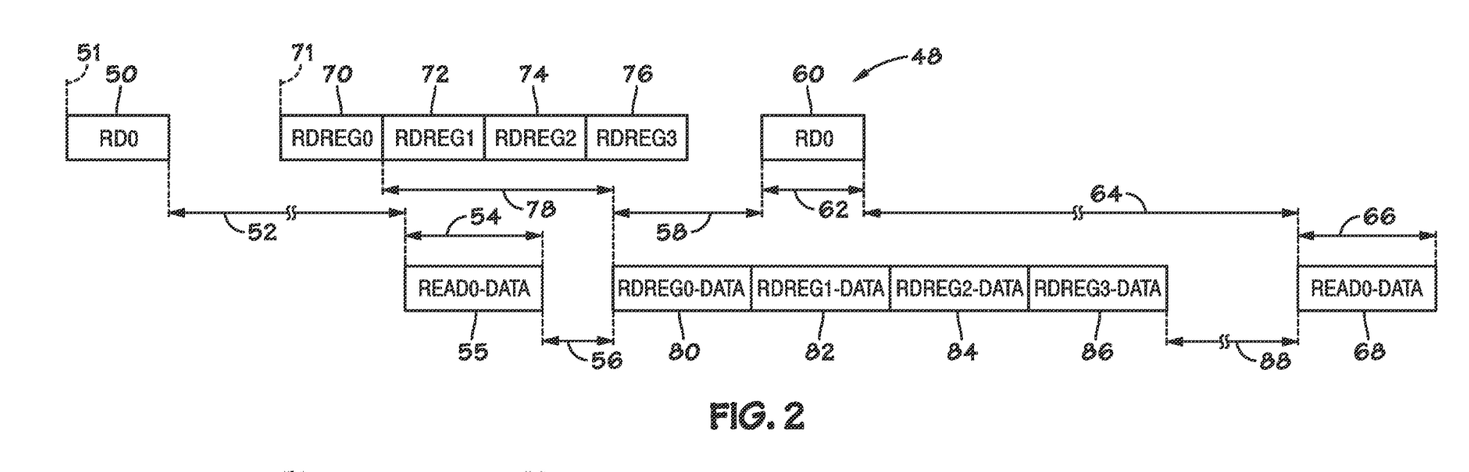
FIG. 2 illustrates a simplified diagram illustrating a first technique for register accesses during a memory operation of the memory device of FIG. 1, according to an embodiment of the present disclosure.

FIG. 2 illustrates an example of a diagram 48 in which register operations are performed concurrently with operations of the memory device 10. As illustrated, a data read operation 50 of a location in a memory partition 12 of the memory device 10 is initiated at time 51. While FIG. 2 illustrates a data read operation 50, it should be noted that a similar technique to that described below is applicable to a write operation (i.e., writing of data to the memory device 10, specifically one or more of the memory partitions 12). As illustrated in FIG. 2, the time for the execution of the data read operation 50 including accessing of the data in the memory partition 12 is illustrated by time period 52, which may represent an array read latency period (i.e., the time to access a particular addressed array of a memory partition 12). Time period 54 (which may occur immediately subsequent to time period 52) represents the time in which the accessed data 55 is read out from the memory device 10. In some embodiments, time period 56 and time period 58 may occur (respectively) immediately subsequent to time period 54. Time period 56 represents a timing gap between the end of the accessed data 55 being read out from the memory device 10 and the reading out of accessed register data 80, which corresponds to the register data from register read operation 70. Time period 58 represents a timing gap between the reading out of accessed register data 80 and the execution of another data read operation, data read operation 60. Time period 62, subsequent to time period 58, represents the amount of time to initiate and/or transmit the data read operation 60 (e.g., a data read operation command), for example, from the memory controller 17 to the memory device 10 to access data at a particular location in a memory partition 12. Time period 64 represents the execution of the data read operation 60 including accessing of the second data in the addressed memory partition 12. Time period 66 may occur immediately thereafter, whereby time period 66 represents the time in which the accessed data 68 corresponding to data read operation 60 is read out from the memory device 10.

FIG. 2 illustrates register operations concurrent with memory device 10 operations (e.g., a data read from the memory device 10 while initiating access requests to registers). As illustrated, during the time period 52 (i.e., the array read latency period), the memory controller 17 can initiate a register read operation 70 at time 71. That is, as the memory controller 17 is issuing no read commands between data read operation 50 and data read operation 60, an input channel to the memory device 10 is available. The memory controller 17 can utilize the available input channel to the memory device 10 to issue and transmit a register read command that corresponds to the register read operation 70. In this manner, the register read operation 70 is interspersed between the data read operation 50 and the data read operation 60 (e.g., during data read operations).

As illustrated, register read operation 72, register read operation 74, and register read operation 76 can be initiated subsequent to register read operation 70. In one embodiment, the register read operation 70 is a read of a first register, the register read operation 72 is a read of a second register, the register read operation 74 is a read of a third register, and register read operation 76 is a read of a fourth register. However, it should be noted that one or more of the register read operation 70, the register read operation 72, the register read operation 74, and the register read operation 76 can be of the same (i.e., a common) register while still allowing for reads without a gap therebetween. Indeed, as illustrated, the memory controller 17 can initiate one or more of the register read operation 70, the register read operation 72, the register read operation 74, and the register read operation 76 immediately subsequent to one another, i.e., without timing gaps therebetween, so as to increase the number of register accesses that can be performed while the channel to the memory device 10 is free between the data read operation 50 and the data read operation 60.

Time period 78 may represent a register read latency period (i.e., the time to access a particular addressed register of the memory device 10). In some embodiments, the memory controller 17 may cease to transmit additional read operations subsequent to the time period 78 expiring. In other embodiments, the memory controller 17 may be programmed to or may determine a time at which to cease to transmit additional read operations based upon allowing for a predetermined gap of time between the last transmitted register read operation 76 and the data read operation 60, so as to insure that collisions of signals and/or data do not occur.

Likewise, the memory controller 17 can determine or can be programmed to initiate the register read operation 70 at a predetermined time, such as at time 71. Time 71 can be chosen based upon the register read latency period (i.e., time period 78), so that there is a timing gap, represented by time period 56, between the accessed data 55 being read out from the memory device 10 and the reading out of the accessed register data 80, which corresponds to the register data from register read operation 70. This timing gap provided by time period 56 may be beneficial to insure that collisions of signals and/or data do not occur. In general, time period 56 exists because of differing access times and differing internal paths that the register data and array data may travel on the die (memory device 10). Thus, in some embodiments, time period 56 may also be zero. The memory controller 17 initiating one or more of the register read operation 70, the register read operation 72, the register read operation 74, and the register read operation 76 immediately subsequent to one another, i.e., without timing gaps therebetween, results in the accessed register data 80, the accessed register data 82 (which corresponds to the register data from register read operation 72), the accessed register data 84 (which corresponds to the register data from register read operation 74), and the accessed register data 86 (which corresponds to the register data from register read operation 76) being transmitted immediately subsequent to one another.

Additionally, FIG. 2 illustrates a timing gap, represented by time period 88, between the accessed register data 86 being read out from the memory device 10 and the reading out of the accessed data 68 corresponding to the data read operation 60. This timing gap can, for example, prevent collisions of signals and/or data that might otherwise occur when interspersing the memory reads and register reads of the memory device 10 that are initiated and controlled by the memory controller 17. Similar to time period 56, time period 88 also exists because of differing access times and differing internal paths that the register data and array data may travel on the die (memory device 10). Thus, in some embodiments, time period 88 may also be zero.

As noted above, FIG. 2 illustrates an example of a diagram 48 in which register operations are performed concurrently with operations of the memory device 10 and is described in conjunction with read operations. However, the techniques of FIG. 2 also apply to write operations whereby the data read operation 50 and the data read operation 60 instead are data write operations to write data to specific locations in one or more memory partitions 12 and the register read operation 70, the register read operation 72, the register read operation 74, and the register read operation 76 are instead register write operations to specific resisters in the memory device 10. It should be noted that in conjunction with register write operations, more timing gaps may be determined and/or implemented by the memory controller 17, for example, when the write operations are to configuration registers that modify the behavior of the memory device itself (i.e., sequential writes may include sufficient time periods therebetween to allow for the configuration registers to reflect or execute a modification of the behavior of the memory device).

Furthermore, while register read operations and array read commands have been described in conjunction with one another and register write operations and array write operations have been described in conjunction with one another, it should be appreciated that register read operations may be performed interspersed with (e.g., during) array write commands and that register write operations may be performed interspersed with (e.g., during) array read operations. Additionally, in conjunction with register write operations, one or more of the accessed register data 80, the accessed register data 82, the accessed register data 84, and the accessed register data 86 may not necessarily be present, as the data may be a part of the register write command itself.

Figure 3:
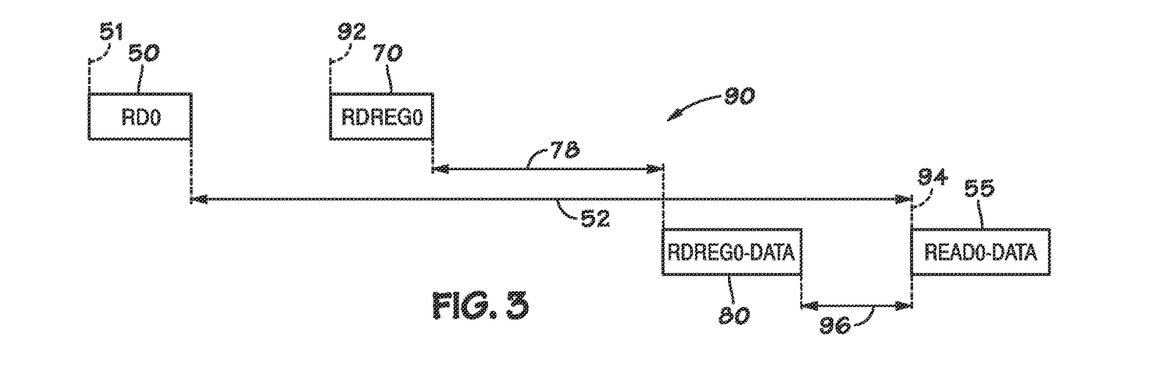
FIG. 3 illustrates a simplified diagram illustrating a second technique for register accesses during a memory operation of the memory device of FIG. 1, according to an embodiment of the present disclosure.

Another technique for register accesses during a memory operation of the memory device 10 is illustrated in diagram

90 of FIG. 3. As illustrated, a data read operation 50 of a location in a memory partition 12 of the memory device 10 is initiated at time 51. While FIG. 3 illustrates a data read operation 50, it should be noted that a similar technique to that described below is applicable to a write operation (i.e., writing of data to the memory device 10, specifically one or more of the memory partitions 12). As illustrated in FIG. 3, the time for the execution of the data read operation 50 including accessing of the data in the memory partition 12 is illustrated by time period 52, which may represent an array read latency period (i.e., the time to access a particular addressed array of a memory partition 12). However, in contrast to the technique described above with respect to FIG. 2, the memory controller 17 can initiate a register read operation 70 at time 92. Time 92 is set as a predetermined value transmitted to the memory controller 17 or may be determined by the memory controller 17. Time 92, as illustrated, occurs during the array read latency period (i.e., time period 52). Time 92 may, for example, be selected so that the register read operation 70 (i.e., a register read command), inclusive of time period 78 representative of a register read latency period (i.e., the time to access a particular addressed register of the memory device 10) and the accessed data 80 being read out from the memory device 10 wholly occurs within the array read latency period represented by time period 52.

In this manner, both the register read operation 70 and the reading out of the accessed register data 80 is performed prior to time 94, where time 94 represents the initiation of the accessed data 55 being read out from the memory device 10 in conjunction with the data read operation 50. Thus, the memory controller 17 can determine or can be programmed to initiate the register read operation 70 at a predetermined time, such as at time 92. Time 92 can be chosen so that there is a timing gap, represented by time period 96, between the reading out of the accessed register data 80, which corresponds to the register data from register read operation 70, and the accessed data 55 being read out from the memory device 10 in connection with the data read operation 50. This timing gap provided by time period 96 may be beneficial to insure that collisions of signals and/or data do not occur.

Additionally, the memory controller 17 can determine or can be programmed to select the time 92 based on a number of register read operations to be performed. Thus, one or more than one register read operation can be accommodated depending on the timing rules, e.g., size of gaps for time 92. In this manner, time 92 may represent the time at which the register read operation 70 is initiated and an additional one or more register read operations (e.g., register read operation 72, register read operation 74, register read operation 76) can be initiated immediately subsequent to one another, i.e., without timing gaps therebetween. However, the results in the accessed register data 80 as well as the accessed register data 82 (which corresponds to the register data from register read operation 72), the accessed register data 84 (which corresponds to the register data from register read operation 74), and the accessed register data 86 (which corresponds to the register data from register read operation 76), are to be transmitted prior to time 94 and/or prior to time period 96.

For any multiple register accesses undertaken in conjunction with the technique outlined in FIG. 3, the accesses can be to the same or differing registers. Likewise, while FIG. 3 illustrates an example of a diagram 90 in which register operations are performed concurrently with operations of the memory device 10 and is described in conjunction with read operations, the techniques of FIG. 3 also apply to write operations whereby the data read operation 50 is instead a data write operation to write data to specific locations in one or more memory partitions 12 and the register read operation 70 (or additional register read operation 72, register read operation 74, and register read operation 76) is instead a register write operations to specific resisters in the memory device 10. It should be noted that in conjunction with register write operations, more timing gaps may be determined and/or implemented by the memory controller 17, for example, when the write operations are to configuration registers that modify the behavior of the memory device itself (i.e., sequential writes may include sufficient time periods therebetween to allow for the configuration registers to reflect or execute a modification of the behavior of the memory device).

Figure 4:
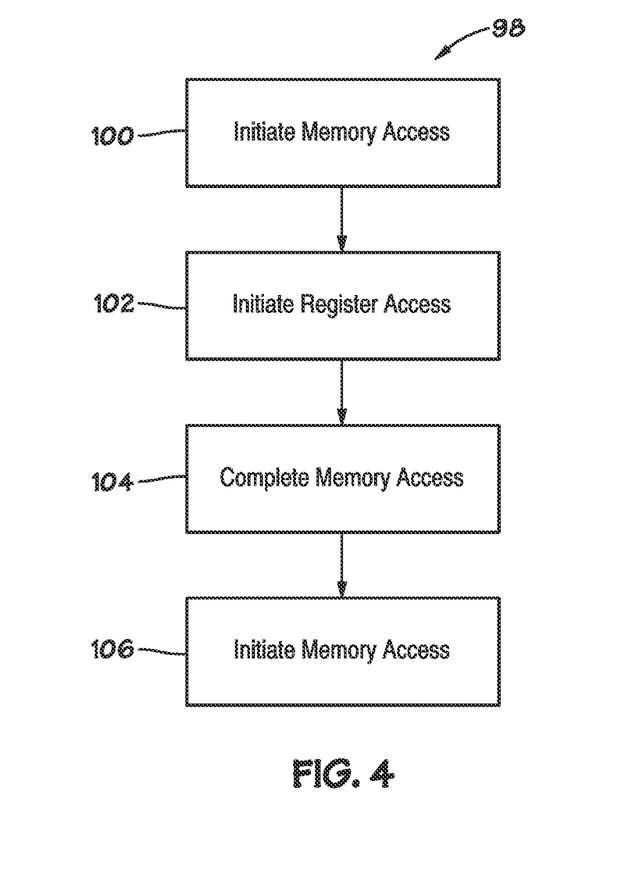
FIG. 4 illustrates a flow chart of a method for writing data to or reading data from a register within the memory device of FIG. 1, according to an embodiment of the present disclosure.

With the foregoing in mind, FIG. 4 illustrates a flow chart of a method 98 for accessing a register (e.g., writing data to or reading data from a register) of the memory device 10. It should be noted that the method 98 may be performed using the circuit components of FIG. 1 or with a processor in place of or in addition to the memory controller 17 and coupled to the memory controller 17. That is, the processor may be any suitable processing device that may receive signals, perform logic functions, execute computer-readable code stored on a computer-readable medium, and the like. By way of example, the following description of the method 98 is described as being performed by a processor or the memory controller 17, but it should be understood that other suitable component (e.g., logical circuit components) may be used to perform the method 98.

Referring to FIG. 4, at step 100, memory controller 17 (for example, as controlled via a processor) initiates a memory access. This memory access may include a read operation of data from a particular memory partition 12 or a write operation of data to a particular memory partition 12 of the memory device 10. In step 102, the memory controller 17 (for example, as controlled via a processor) initiates a register access. The register access in step 102 may include a read operation of one register or multiple read operations of one or more than one register of the memory device 10, for example, in the manner described above with respect to one of FIG. 2 or FIG. 3.

In step 104, access to the memory (e.g., reading of data from a memory partition or writing data to a memory partition 12) is completed. In conjunction with FIG. 2, one or more register read operations, such as register read operation 70, register read operation 72, register read operation 74, register read operation 76 may be completed prior to accessed data 55 being read out from the memory device 10 in conjunction with the data read operation 50.

Furthermore, in conjunction with FIG. 2, one or more of the accessed register data 80 (which corresponds to the register data from register read operation 70), the accessed register data 82 (which corresponds to the register data from register read operation 72), the accessed register data 84 (which corresponds to the register data from register read operation 74), and the accessed register data 86 (which corresponds to the register data from register read operation 76), may be completed prior to step 106.

In step 106, the memory controller 17 (for example, as controlled via a processor) initiates a memory access, for example, data read operation 60. In conjunction with FIG. 2, one or more of the accessed register data 80 (which corresponds to the register data from register read operation 70), the accessed register data 82 (which corresponds to the register data from register read operation 72), the accessed register data 84 (which corresponds to the register data from register read operation 74), and the accessed register data 86

(which corresponds to the register data from register read operation 76), may be completed in conjunction with or subsequent to step 106.

Returning to step 104, access to the memory (e.g., reading of data from a memory partition or writing data to a memory partition 12) is completed. In conjunction with FIG. 3, one or more register read operations, such as register read operation 70, register read operation 72, register read operation 74, register read operation 76 may be completed prior to accessed data 55 being read out from the memory device 10 in conjunction with the data read operation 50. Furthermore, in conjunction with FIG. 3, all of the one or more of the accessed register data 80 (which corresponds to the register data from register read operation 70), the accessed register data 82 (which corresponds to the register data from register read operation 72), the accessed register data 84 (which corresponds to the register data from register read operation 74), and the accessed register data 86 (which corresponds to the register data from register read operation 76), are completed prior to step 106, in which the memory controller 17 (for example, as controlled via a processor) initiates a memory access, for example, a data read operation 60.

While the present disclosure may be susceptible to various modifications and alternative forms, specific embodiments have been shown by way of example in the drawings and have been described in detail herein. However, it should be understood that the present disclosure is not intended to be limited to the particular forms disclosed. Rather, the present disclosure is intended to cover all modifications, equivalents, and alternatives falling within the spirit and scope of the present disclosure as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. A device, comprising:
   a memory partition;
   a plurality of registers, wherein a first register of the plurality of registers when in operation stores a value associated with one of a first configuration setting of a memory device comprising the memory partition, a second configuration setting of a component of the memory device, a first status of the memory device, a second status of the component of the memory device, a first parameter of the memory device, or a second parameter of the component of the memory device, or a predetermined pattern; and
   a memory controller that when in operation accesses a first location of the memory partition concurrently with accessing the first register, wherein concurrently accessing the first register comprises initiating access of the first register at a predetermined time during a latency period associated with the access of the first location of the memory partition, wherein the latency period comprises a period of time to access the first location of the memory partition, wherein the predetermined time is selected to allow for completion of the access of the first register during the latency period.

2. The device of claim 1, wherein the memory controller in operation initiates a read of data from the first location of the memory partition as the access of the first location of the memory partition.

3. The device of claim 2, wherein the memory controller in operation receives the data from the first location of the memory partition as the access of the first location of the memory partition.

4. The device of claim 3, wherein the memory controller in operation initiates a read of a value stored in the first register subsequent to initiating the read of the data from the first location of the memory partition as accessing the first register.

5. The device of claim 4, wherein the memory controller in operation receives the value from the first register subsequent to receiving the data from the first location of the memory partition.

6. The device of claim 5, wherein the memory controller in operation accesses a second location of the memory partition or a second memory partition of the memory device subsequent to receiving the value from the first register.

7. The device of claim 4, wherein the memory controller in operation receives the value from the first register prior to receiving the data from the memory partition.

8. The device of claim 7, wherein the memory controller in operation accesses a second location of the memory partition or a second memory partition of the memory device subsequent to receiving the value from the first register.

9. A device, comprising:
   a memory controller that when in operation:
      initiates an access of a first portion of a memory partition at a predetermined first time;
      initiates an access of a register at a predetermined second time during a latency period associated with access of the first portion of the memory partition, wherein the latency period comprises a time period in which to access the first portion of the memory partition, wherein the second predetermined time is selected to allow for completion of the access of first register during the latency period; and
      initiates an access of a second portion of the memory partition at a predetermined third time occurring during the access of the first portion of the memory partition or subsequent to completion of the access of the first portion of the memory partition or initiates a access of a second memory partition at the predetermined third time.

10. The device of claim 9, wherein the memory controller when in operation completes transmission of a read command to the register or a write command to the register as the access of the register prior to initiating the access of the second portion of the memory partition or the access of the second memory partition at the predetermined third time.

11. The device of claim 10, wherein the memory controller when in operation completes transmission of a second read command to the register or a second write command to the register as an access of the register prior to initiating the access of the second portion of the memory partition or initiating the access of the second memory partition at the predetermined third time.

12. The device of claim 10, wherein the memory controller when in operation completes transmission of a second read command to a second register or a second write command to the second register as an access of the register prior to initiating the access of the second portion of the memory partition or initiating the access of the second memory partition at the predetermined third time.

13. The device of claim 9, wherein the memory controller when in operation receives a value stored in the register or completes a write of the value to the register as the access of the register prior to initiating the access of the second portion of the memory partition or initiating the access of the second memory partition at the predetermined third time.

14. The device of claim 13, wherein the memory controller when in operation receives the value stored in the register as the access of the register prior to the memory controller receiving data from the memory partition as the access of the first portion of the memory partition.

15. The device of claim 14, wherein the memory controller when in operation completes transmission of a read command to a second register prior to the memory controller receiving data from the memory partition as the access of the first portion of the memory partition.

16. The device of claim 15, wherein the memory controller when in operation receives a second value stored in the second register prior to the memory controller receiving data from the memory partition as the access of the first portion of the memory partition.

17. The device of claim 13, wherein the memory controller when in operation completes the write of the value to the register as the access of the register prior to the memory controller writing data to the memory partition as the access of the first portion of the memory partition.

18. The device of claim 17, wherein the memory controller when in operation completes transmission of a write command to a second register prior to the memory controller receiving data from the memory partition as the access of the first portion of the memory partition.

19. The device of claim 18, wherein the memory controller when in operation completes the writing of a second value to the second register prior to the memory controller receiving data from the memory partition as the access of the first portion of the memory partition.

20. A method, comprising:
   initiating a memory access of a memory device via a memory controller;
   initiating, via the memory controller, a register access of the memory device concurrently with the memory access of the memory device by initiating access of the register at a predetermined time during a latency period associated with the memory access of the memory device, wherein the latency period comprises a period of time to access the memory device, wherein the predetermined time is selected to allow for completion of the access of the register during the latency period;
   completing the memory access of the memory device; and
   initiating a second memory access of the memory device via the memory controller subsequent to completion of the memory access of the memory device.

21. The method of claim 20, comprising completing the register access of the memory device prior to completing the memory access of the memory device.

\* \* \* \* \*